(12) United States Patent　(10) Patent No.:　US 12,667,015 B2

Kawamoto et al.　(45) Date of Patent:　Jun. 23, 2026

(54) SEMICONDUCTOR DEVICE WITH PAIRS OF SIGNAL PADS CONCENTRATED ON CONTROL IC SIDE

(71) Applicant: Mitsubishi Electric Corporation, Tokyo (JP)

(72) Inventors: Keisuke Kawamoto, Tokyo (JP); Keisuke Eguchi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 541 days.

(21) Appl. No.: 18/180,948

(22) Filed: Mar. 9, 2023

(65) Prior Publication Data

US 2023/0395582 A1　Dec. 7, 2023

(30) Foreign Application Priority Data

Jun. 1, 2022　(JP) ................................. 2022-089429

(51) Int. Cl.
| | |
|---|---|
| *H01L 23/00* | (2006.01) |
| *G11C 5/06* | (2006.01) |
| *H01L 21/768* | (2006.01) |
| *H01L 23/495* | (2006.01) |
| *H10B 51/10* | (2023.01) |

(Continued)

(52) U.S. Cl.
CPC ......... *H10W 90/00* (2026.01); *H10W 72/547* (2026.01); *H10W 72/90* (2026.01); *H10W 72/59* (2026.01); *H10W 90/753* (2026.01)

(58) Field of Classification Search
CPC ..... H01L 23/31; H01L 23/48; H01L 23/4956; H01L 23/49575; H01L 2224/49; H01L 2224/491–49175; H01L 24/85; H01L 24/42–49; H01L 24/48227; H01L 2224/48011; H10W 72/07554; H10W 72/547; H10W 72/5473; H10W 72/5475;

(Continued)

(56) References Cited

U.S. PATENT DOCUMENTS

| | | | |
|---|---|---|---|
| 2001/0019856 A1* | 9/2001 | Takahashi ............... | H01L 24/97 |
| | | | 257/E23.044 |
| 2013/0009291 A1* | 1/2013 | Kim .................... | H01L 23/3142 |
| | | | 438/107 |
| 2017/0271451 A1 | 9/2017 | Matsushita et al. | |

FOREIGN PATENT DOCUMENTS

| | | | | |
|---|---|---|---|---|
| JP | H05291485 A | * | 11/1993 | ............. H01L 24/06 |
| JP | 2017-168597 A | | 9/2017 | |

OTHER PUBLICATIONS

"Notice of Reasons for Refusal" Office Action issued in JP 2022-089429; mailed by the Japanese Patent Office on Mar. 11, 2025.

* cited by examiner

*Primary Examiner* — Wael M Fahmy
*Assistant Examiner* — Aneesa Riaz Baig
(74) *Attorney, Agent, or Firm* — Studebaker Brackett PLLC

(57)　ABSTRACT

An object is to provide a technique capable of improving productivity of a semiconductor device by reducing a wiring length of a wire. A semiconductor device includes a semiconductor element and a control IC controlling the semiconductor element, wherein the semiconductor element includes a pair of signal pad groups made up of a plurality of signal pads, the control IC includes a plurality of signal pads, the plurality of signal pads in the control IC are wire-bonding connected to the signal pad group closer to the plurality of signal pads in the control IC in the pair of signal pad groups in the semiconductor element.

11 Claims, 4 Drawing Sheets

(51) Int. Cl.
| | | |
|---|---|---|
| *H10B 51/20* | (2023.01) | |
| *H10D 30/01* | (2025.01) | |
| *H10D 30/47* | (2025.01) | |
| *H10D 62/85* | (2025.01) | |
| *H10D 64/64* | (2025.01) | |
| *H10H 20/852* | (2025.01) | |
| *H10H 20/857* | (2025.01) | |
| *H10W 72/50* | (2026.01) | |
| *H10W 72/59* | (2026.01) | |
| *H10W 72/90* | (2026.01) | |
| *H10W 90/00* | (2026.01) | |

(58) Field of Classification Search
CPC   H10W 72/5445; H10W 90/00; H10W 90/753
See application file for complete search history.

F I G. 3
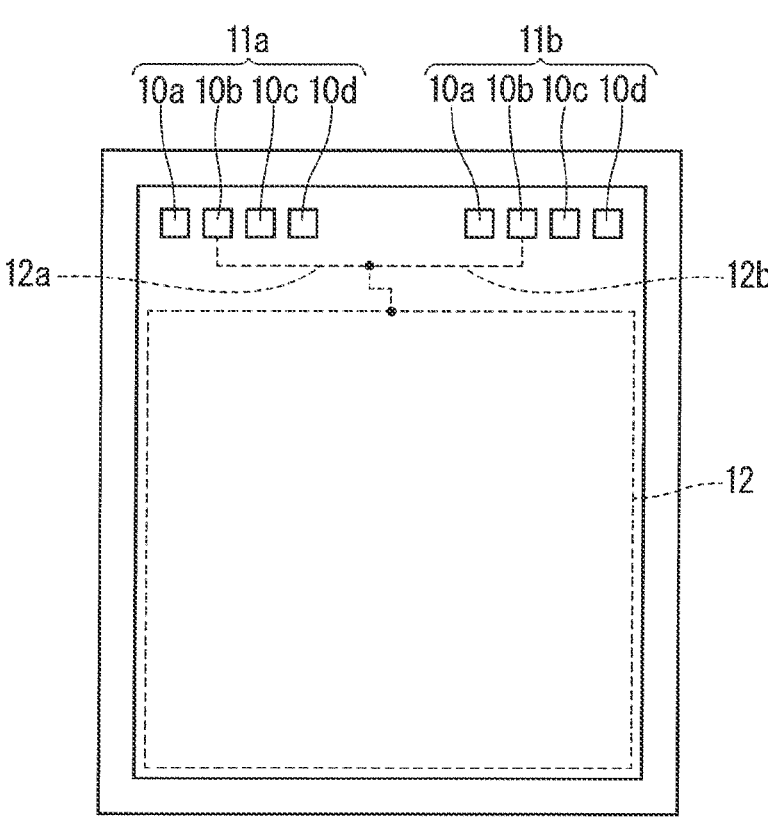
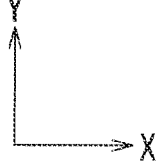

SEMICONDUCTOR DEVICE WITH PAIRS OF SIGNAL PADS CONCENTRATED ON CONTROL IC SIDE

BACKGROUND OF THE INVENTION

Field of the Invention

The present disclosure relates to a semiconductor device.

Description of the Background Art

Japanese Patent Application Laid-Open No. 2017-168597 discloses a configuration that a plurality of signal pads are wire-bonding connected to each other in an insulated gate bipolar transistor (IGBT) chip including the plurality of signal pads including a plurality of sense signal pads and a plurality of gate signal pads.

SUMMARY

However, a wiring length of a wire is not considered in a technique described in Japanese Patent Application Laid-Open No. 2017-168597. Thus, the wiring length of the wire increases when a signal pad of a control IC is wire-bonding connected to a signal pad located farther away from the signal pad of the control IC in the plurality of signal pads of the IGBT chip in a semiconductor device including the control IC controlling the IGBT chip. Accordingly, there is a problem that wires adjacent to each other have contact with each other at a time of sealing the IGBT chip and the control IC, wires are easily peeled, and productivity of the semiconductor device is deteriorated.

An object of the present disclosure is to provide a technique capable of improving productivity of a semiconductor device by reducing a wiring length of a wire.

A semiconductor device according to the present disclosure includes a semiconductor element and a control IC. The control IC controls the semiconductor element. The semiconductor element includes a pair of signal pad groups made up of a plurality of signal pads. The control IC includes a plurality of signal pads. The plurality of signal pads in the control IC are wire-bonding connected to the signal pad group closer to the plurality of signal pads in the control IC in the pair of signal pad groups in the semiconductor element.

A wiring length of a wire between the plurality of signal pads of the semiconductor element and the plurality of signal pads of the control IC can be reduced, thus contact of the wires adjacent to each other at a time of sealing the semiconductor element and the control IC and peeling of the wire can be suppressed. Accordingly, productivity of the semiconductor device can be enhanced.

These and other objects, features, aspects and advantages of the present invention will become more apparent from the following detailed description of the present invention when taken in conjunction with the accompanying drawings.

BRIEF DESCRIPTION OF THE DRAWINGS

FIG. 3 is a top view of a semiconductor element included in a semiconductor device according to an embodiment 2.

DESCRIPTION OF THE PREFERRED EMBODIMENTS

Embodiment 1

<Configuration of Semiconductor Device>

Figure 1:
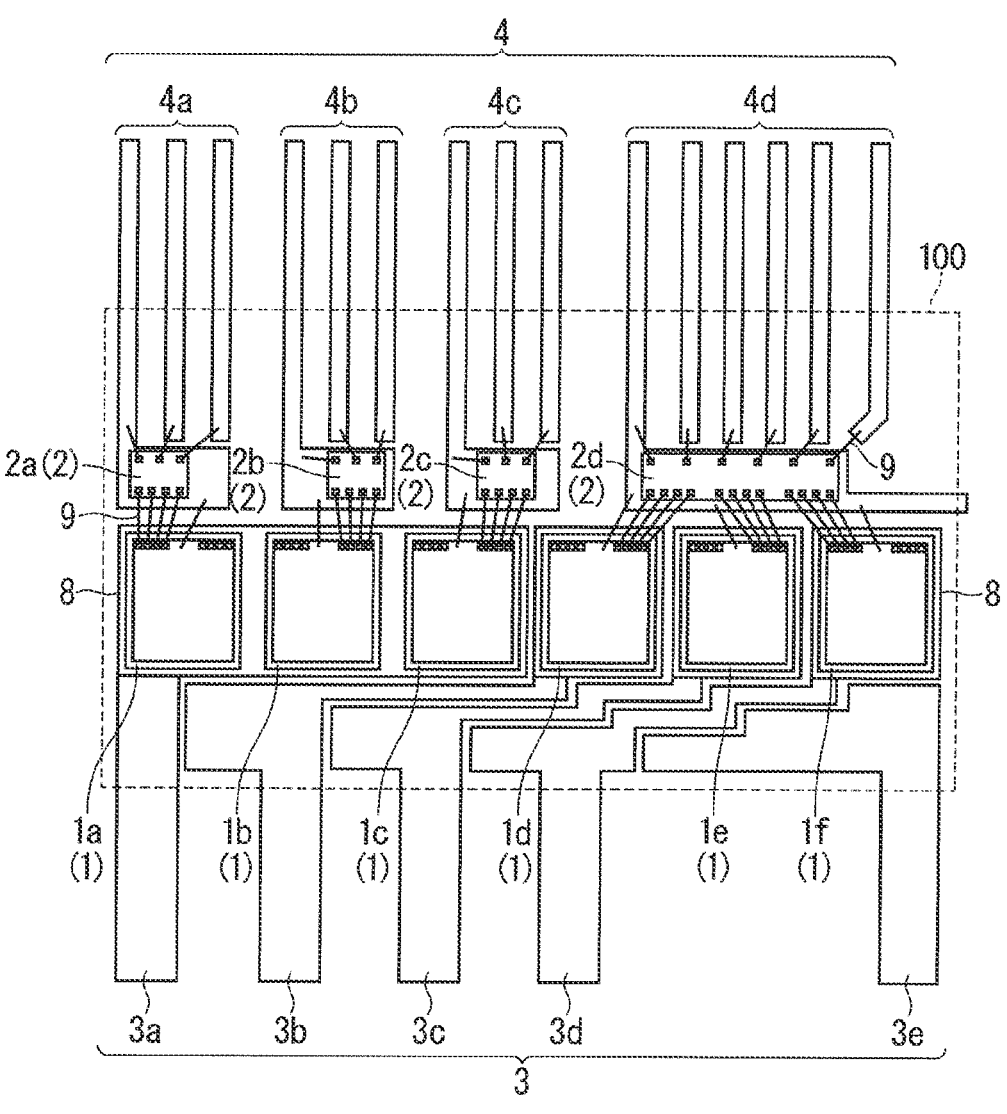
FIG. 1 is a top view of a semiconductor device according to an embodiment 1.
Figure 1:
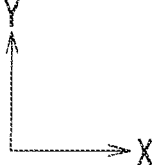

An embodiment 1 is described hereinafter using the drawings. FIG. 1 is a top view of a semiconductor device 100 according to the embodiment 1.

In FIG. 1, an X direction and a Y direction are perpendicular to each other. An X direction and a Y direction illustrated in the subsequent drawings are also perpendicular to each other. In the description hereinafter, a direction including the X direction and a –X direction as a direction opposite to the X direction is also referred to as "an X axis direction". In the description hereinafter, a direction including the Y direction and a –Y direction as a direction opposite to the Y direction is also referred to as "a Y axis direction".

As illustrated in FIG. 1, the semiconductor device 100 is a three-phase alternating inverter circuit, and includes six semiconductor elements 1a, 1b, 1c, 1d, 1e, and 1f, four control ICs 2a, 2b, 2c, and 2d, a power lead frame 3, a control lead frame 4, and a mold resin (not shown).

The six semiconductor elements 1a. 1b, 1c, 1d, 1e, and 1f are reverse-conducting IGBTs in which a switching part and a reflux part constitute one chip. The three semiconductor elements 1a, 1b, and 1c mounted on a high potential side are disposed on one conductive pattern 8. The three semiconductor elements 1d, 1e, and 1f mounted on a low potential side are disposed on three conductive patterns 8, respectively. The six semiconductor elements 1a, 1b, 1c, 1d, 1e, and 1f are wire-bonding connected to the four control ICs 2a, 2b, 2c, and 2d by a wire 9. When the semiconductor elements 1a, 1b, 1c, 1d, 1e, and 1f need not be distinguished from each other, each of them is referred to as the semiconductor element 1.

The four control ICs 2a, 2b, 2c, and 2d are low voltage integrated circuits (LVIC), and control the six semiconductor elements 1a, 1b, 1c, 1d, 1e, and 1f. The four control ICs 2a, 2b, 2c, and 2d, the power lead frame 3, and the control lead frame 4 are connected by the wire 9, that is to say, wire-bonding connected to each other. When the control ICs 2a, 2b, 2c, and 2d need not be distinguished from each other, each of them is referred to as the control IC 2.

A mold resin is a sealing material, and integrally seals the six semiconductor elements 1a, 1b, 1c, 1d, 1e, and 1f, and the four control ICs 2a, 2b, 2c, and 2d.

The power lead frame 3 includes a P terminal 3a connected to collector electrodes of the three semiconductor elements 1a, 1b, and 1c mounted on the high potential side, a U terminal 3b, a V terminal 3c, and a W end portion 3d connected to collector electrodes of the three semiconductor elements 1d, 1e, and 1f mounted on the low potential side, respectively, and an N terminal 3e connected to emitter electrodes of the three semiconductor elements 1d, 1e, and 1f mounted on the low potential side.

The control lead frame 4 includes a U-phase lead frame 4a, a V-phase lead frame 4b, and a W-phase lead frame 4c on the high potential side, and includes an N-phase lead frame 4d on the low potential side. Each of the U-phase lead frame 4a, the V-phase lead frame 4b, and the W-phase lead frame 4c includes a control terminal, an IN terminal, and a VCC terminal. The N-phase lead frame 4*d* includes a control terminal, a VCC terminal, three IN terminals, and an FO terminal.

<Configuration of Signal Pad in Semiconductor Element>

Figure 2:
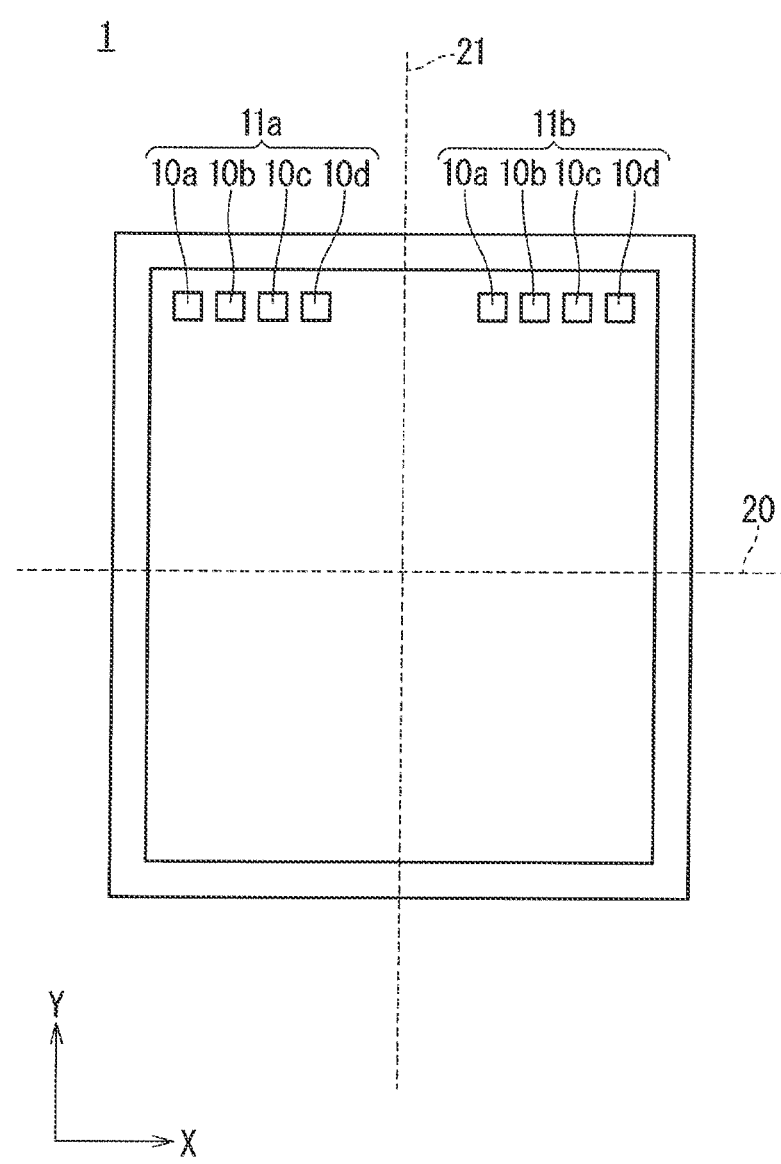
FIG. 2 is a top view of a semiconductor element included in the semiconductor device according to the embodiment 1.

Described next using FIG. 2 is a configuration of a signal pad in the semiconductor element 1 as a feature of the embodiment 1. FIG. 2 is a top view of the semiconductor element 1 included in the semiconductor device 100 according to the embodiment 1.

As illustrated in FIG. 2, the semiconductor element 1 includes a pair of signal pad groups 11*a* and 11*b* made up of a plurality of (four) signals pads 10*a*, 10*b*, 10*c*, and 10*d*. The pair of signal pad groups 11*a* and 11*b* are disposed along a first direction (X axis direction). A sign 21 indicates a center line of the semiconductor element 1 extending in the first direction. In the pair of signal pad groups 11*a* and 11*b*, one signal pad group 11*a* is disposed on a −X side (one side) of a center line 21 of the semiconductor element 1 extending in a second direction (Y axis direction) perpendicular to the first direction, and the other signal pad group 11*b* is disposed on an X side (the other side) of the center line 21 of the semiconductor element 1.

The pair of signal pad groups 11*a* and 11*b* are disposed in the same order on one side and the other side of the center line 21 of the semiconductor element 1. Particularly, the pair of signal pad groups 11*a* and 11*b* are disposed in an order of a sense signal pad 10*a*, a gate signal pad 10*b*, an anode signal pad 10*c* of a temperature sense diode, and a cathode signal pad 10*d* of the temperature sense diode from the −X side toward the X side, respectively. The order of the signal pads 10*a*, 10*b*, 10*c*, and 10*d* is one example, thus is not limited thereto illustrated in FIG. 2.

In the embodiment 1, the plurality of signal pads in the control IC 2 are wire-bonding connected to one of the signal pad groups 11*a* and 11*b* closer to the plurality of signal pads in the control IC 2 in the pair of signal pad groups 11*a* and 11*b* in the semiconductor element 1. This configuration is described hereinafter.

As illustrated in FIG. 1 and FIG. 2, the semiconductor elements 1*a*, 1*b*, and 1*c* are wire-bonding connected to the control ICs 2*a*, 2*b*, and 2*c*, respectively. Since the semiconductor elements 1*a*, 1*b*, and 1*c* and the control ICs 2*a*, 2*b*, and 2*c* are disposed close to each other, respectively, thus a wiring length of the wire 9 does not matter much compared with a case of the control IC 2*d*. However, the control IC 2*d* includes three groups of the plurality of signal pads, and the semiconductor elements 1*d*, 1*e*, and 1*f* are wire-bonding connected to the control IC 2*d*, thus the semiconductor elements 1*d* and 1*f* located on both sides in the three semiconductor elements 1*d*, 1*e*, and 1*f* have a longer distance from the control IC 2*d* than the semiconductor element 1*e* located in a center portion.

Thus, in the semiconductor element 1*d*, the plurality of signal pads in the control IC 2*d* are wire-bonding connected to the signal pad group 11*b* closer to the plurality of signal pads in the control IC 2*d* in the pair of signal pad groups 11*a* and 11*b* in the semiconductor element 1*d*. Also in the semiconductor element 1*f*, the plurality of signal pads in the control IC 2*d* are wire-bonding connected to the signal pad group 11*a* closer to the plurality of signal pads in the control IC 2*d* in the pair of signal pad groups 11*a* and 11*b* in the semiconductor element 1*f*.

Accordingly, the wiring length of the wire 9 connecting the semiconductor elements 1*d* and 1*f* and the control IC 2*d* can be reduced. In the similar manner, also in the semiconductor elements 1*a*, 1*b*, and 1*c* and the control ICs 2*a*, 2*b*, and 2*c*, the plurality of signal pads in the control ICs 2*a*, 2*b*, and 2*c* are wire-bonding connected to the signal pad group closer to the plurality of signal pads in the control ICs 2*a*, 2*b*, and 2*c* in the pair of signal pad groups 11*a* and 11*b* in the semiconductor elements 1*a*, 1*b*, and 1*c*, respectively.

Described next is sizes of the signal pads 10*a*, 10*b*, 10*c*, and 10*d* of the semiconductor element 1. In a case where a thin wire is used as the wire 9, wire bonding can be sufficiently performed when a length of one side of an opening of the signal pads 10*a*, 10*b*, 10*c*, and 10*d* (area of an aluminum electrode) is approximately 0.3 mm. Reduction in size of the chip of the semiconductor element 1 contributes to downsizing of the semiconductor device 100, thus the length of one side of the signal pads 10*a*, 10*b*, 10*c*, and 10*d* is preferably equal to or smaller than 0.3 mm.

Although not illustrated in the drawings, each of the plurality of (two) gate signal pads 10*b* in the pair of signal pad groups 11*a* and 11*b* in the semiconductor element 1 is connected to a common gate wiring in the semiconductor element 1. Accordingly, control power source voltage supplied from an outside of the semiconductor device 100 can be sufficiently supplied even in a case where any of the two gate signal pads 10*b* is used.

Effect

As described above, the semiconductor device 100 according to the embodiment 1 includes the semiconductor element 1 and the control IC 2 controlling the semiconductor element 1, wherein the semiconductor element 1 includes the pair of signal pad groups 11*a* and 11*b* made up of the plurality of signal pads 10*a*, 10*b*, 10*c*, and 10*d*, the control IC 2 includes the plurality of signal pads, the plurality of signal pads in the control IC 2 are wire-bonding connected to the signal pad group closer to the plurality of signal pads in the control IC 2 in the pair of signal pad groups 11*a* and 11*b* in the semiconductor element 1.

Specifically, the pair of signal pad groups 11*a* and 11*b* in the semiconductor element 1 are disposed along the first direction, the plurality of signal pads 10*a*, 10*b*, 10*c*, and 10*d* included in each of the signal pad groups 11*a* and 11*b* are disposed in the same order on one side and the other side of the center line 21 of the semiconductor element 1 extending in the second direction perpendicular to the first direction. The pair of signal pad groups 11*a* and 11*b* in the semiconductor element 1 include two sense signal pads 10*a*, and the sense signal pad 10*a* included in one of the pair of signal pad groups 11*a* and 11*b* is wire-bonding connected to one of the plurality of signal pads in the control IC 2.

Accordingly, the wiring length of the wire 9 between the plurality of signal pads 10*a*, 10*b*, 10*c*, and 10*d* of the semiconductor element 1 and the plurality of signal pads of the control IC 2 can be reduced, thus contact of the wires 9 adjacent to each other at the time of sealing the semiconductor element 1 and the control IC 2 and peeling of the wire 9 can be suppressed. Accordingly, productivity of the semiconductor device 100 can be enhanced.

The pair of signal pad groups 11*a* and 11*b* in the semiconductor element 1 include two gate signal pads 10*b*, the plurality of gate wiring are provided in the semiconductor element 1, and two gate signal pads 10*b* are connected by the plurality of gate wirings.

Accordingly, control power source voltage supplied from the outside of the semiconductor device 100 can be sufficiently supplied even in the case where any of the two gate signal pads 10*b* is used, thus a stable operation of the semiconductor device 100 can be achieved.

The semiconductor element 1 is the reverse-conducting IGBT in which the switching part and the reflux part constitute one chip, thus the semiconductor element 1 can be downsized, and such a configuration contributes to downsizing of the semiconductor device 100.

The length of one side of each of the signal pads 10*a*, 10*b*, 10*c*, and 10*d* in the semiconductor element 1 is equal to or smaller than 0.3 mm, thus such a configuration contributes to downsizing of the semiconductor device 100.

Embodiment 2

A semiconductor device 100 according to an embodiment 2 is described next. FIG. 3 is a top view of the semiconductor element 1 included in the semiconductor device 100 according to the embodiment 2. In the description in the embodiment 2, the same reference numerals are assigned to the same constituent elements as those described in the embodiment 1, and the description thereof will be omitted.

As illustrated in FIG. 3, in the embodiment 2, two gate wirings 12*a* and 12*b* branched from a gate wiring 12 provided in the semiconductor device 100 are connected to the gate signal pads 10*b* of the signal pad groups 11*a* and 11*b*, respectively. The plurality of gate wirings 12, 12*a*, and 12*b* connected to two gate signal pads 10*b* have the same impedance. Accordingly, the stable operation of the semiconductor element 1 can be achieved even in the case any of the two gate signal pads 10*b* is used.

In FIG. 3, the gate wiring 12 is illustrated as a rectangular frame, but is actually provided in a rectangular frame.

Embodiment 3

Figure 4:
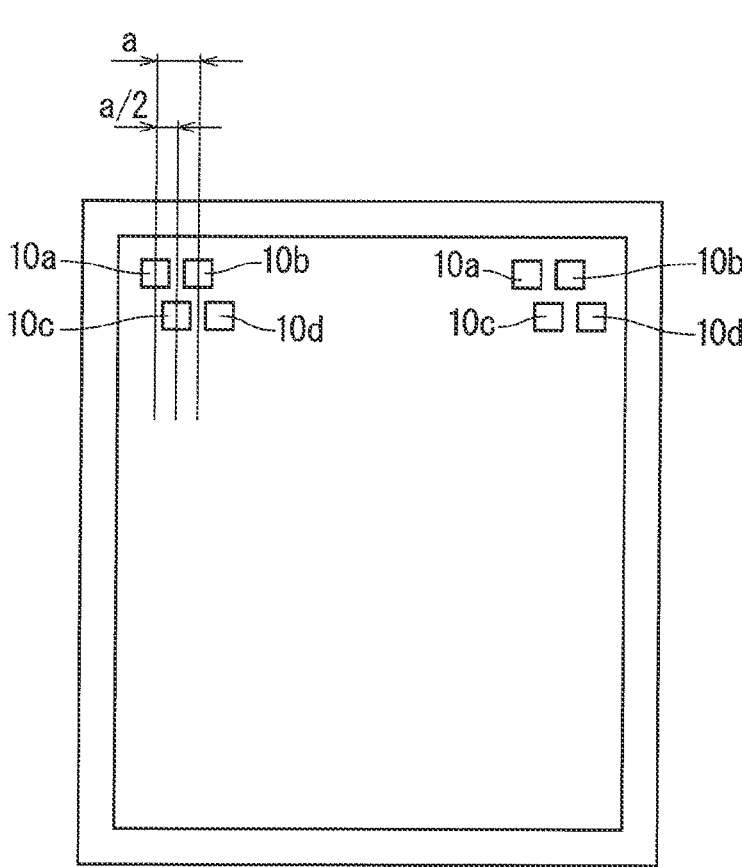
FIG. 4 is a top view of a semiconductor element included in a semiconductor device according to an embodiment 3.
Figure 4:
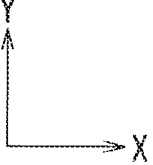

A semiconductor device 100 according to an embodiment 3 is described next. FIG. 4 is a top view of the semiconductor element 1 included in the semiconductor device 100 according to the embodiment 3. In the description in the embodiment 3, the same reference numerals are assigned to the same constituent elements as those described in the embodiments 1 and 2, and the description thereof will be omitted.

As illustrated in FIG. 4, in the embodiment 3, some of the plurality of signal pads 10*a*, 10*b*, 10*c*, and 10*d* in the semiconductor element 1 are disposed in a staggered manner. Specifically, the signal pads 10*c* and 10*d* are disposed in the −Y direction with respect to the signal pads 10*a* and 10*b*, and are further disposed to be shifted in the X direction by half (2/a) an interval (a) between the center line of the signal pad 10*a* in the X axis direction and the center line of the signal pad 10*b* in the X axis direction.

The length of the semiconductor device 100 in the X axis direction can be reduced, thus the wire-bonding connection between the semiconductor element 1 and the control IC 2 can be achieved with the small wiring length. Such a configuration contributes to downsizing of the semiconductor device 100.

Each embodiment can be arbitrarily combined, or each embodiment can be appropriately varied or omitted.

The aspects of the present disclosure are collectively described hereinafter as an additional statement.

Additional Statement 1

A semiconductor device, comprising:
a semiconductor element; and
a control IC controlling the semiconductor element, wherein the semiconductor element includes a pair of signal pad groups made up of a plurality of signal pads,
the control IC includes a plurality of signal pads, and
the plurality of signal pads in the control IC are wire-bonding connected to one of the signal pad groups closer to the plurality of signal pads in the control IC in the pair of signal pad groups in the semiconductor element.

Additional Statement 2

The semiconductor device according to the additional statement 1, wherein
the pair of signal pad groups in the semiconductor element include a plurality of gate signal pads,
a plurality of gate wiring are provided in the semiconductor element, and
the plurality of gate signal pads are connected by the plurality of gate wirings, respectively.

Additional Statement 3

The semiconductor device according to the additional statement 1, wherein
the pair of signal pad groups in the semiconductor element include a plurality of sense signal pads, and
the sense signal pads included in one of the pair of signal pad groups are wire-bonding connected to one of the plurality of signal pads in the control IC.

Additional Statement 4

The semiconductor device according to the additional statement 1, wherein
the pair of signal pad groups in the semiconductor element are disposed along a first direction, and
the plurality of signal pads included in each of the signal pad groups are disposed in a same order on one side and another side of a center line of the semiconductor element extending in a second direction perpendicular to the first direction.

Additional Statement 5

The semiconductor device according to the additional statement 1, wherein
the semiconductor element is a reverse-conducting IGBT in which a switching part and a reflux part constitute one chip.

Additional Statement 6

The semiconductor device according to the additional statement 1, wherein
a length of one side of each of the signal pads in the semiconductor element is equal to or smaller than 0.3 mm.

Additional Statement 7

The semiconductor device according to the additional statement 2, wherein
the plurality of gate wirings connected to the plurality of gate signal pads, respectively, have a same impedance.

Additional Statement 8

The semiconductor device according to the additional statement 1, wherein some of the plurality of signal pads in the semiconductor element are disposed in a staggered manner.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device, comprising:
a semiconductor element; and
a control IC controlling the semiconductor element, wherein
the semiconductor element includes a pair of signal pad groups made up of a plurality of signal pads of the semiconductor element,
the control IC includes a plurality of signal pads of the control IC,
the plurality of signal pads in the control IC are wire-bonding connected to one of the signal pad groups closer to the plurality of signal pads in the control IC in the pair of signal pad groups in the semiconductor element, and
the semiconductor element includes a first side closest to the control IC and a second side farthest from the control IC, and all of the plurality of signal pads of the semiconductor element included in the pair of signal pad groups are positioned closer to the first side of the semiconductor element than to the second side of the semiconductor element.

2. The semiconductor device according to claim 1, wherein
the pair of signal pad groups in the semiconductor element include a plurality of gate signal pads,
a plurality of gate wirings are provided in the semiconductor element, and
the plurality of gate signal pads are connected by the plurality of gate wirings, respectively.

3. The semiconductor device according to claim 1, wherein
the pair of signal pad groups in the semiconductor element include a plurality of sense signal pads, and
the plurality of sense signal pads included in one of the pair of signal pad groups are wire-bonding connected to one of the plurality of signal pads in the control IC.

4. The semiconductor device according to claim 1, wherein
the pair of signal pad groups in the semiconductor element are disposed along a first direction, and
the plurality of signal pads included in each of the signal pad groups are disposed in a same order on one side and another side of a center line of the semiconductor element extending in a second direction perpendicular to the first direction.

5. The semiconductor device according to claim 1, wherein
the semiconductor element is a reverse-conducting IGBT in which a switching part and a reflux part constitute one chip.

6. The semiconductor device according to claim 1, wherein a length of one side of each of the plurality of signal pads of the semiconductor element is equal to or smaller than 0.3 mm.

7. The semiconductor device according to claim 2, wherein
the plurality of gate wirings connected to the plurality of gate signal pads, respectively, have a same impedance.

8. The semiconductor device according to claim 1, wherein
some of the plurality of signal pads of the semiconductor element are disposed in a staggered manner.

9. A semiconductor device, comprising:
a semiconductor element; and
a control IC controlling the semiconductor element, wherein
the semiconductor element includes a pair of signal pad groups made up of a plurality of signal pads of the semiconductor element,
the control IC includes a plurality of signal pads of the control IC,
the plurality of signal pads in the control IC are wire-bonding connected to one of the signal pad groups closer to the plurality of signal pads in the control IC in the pair of signal pad groups in the semiconductor element,
the pair of signal pad groups in the semiconductor element include a plurality of gate signal pads,
a plurality of gate wirings are provided in the semiconductor element, and
the plurality of gate signal pads are connected by the plurality of gate wirings, respectively.

10. The semiconductor device according to claim 9, wherein
the plurality of gate wirings connected to the plurality of gate signal pads, respectively, have a same impedance.

11. A semiconductor device, comprising:
a semiconductor element; and
a control IC controlling the semiconductor element, wherein
the semiconductor element includes a pair of signal pad groups made up of a plurality of signal pads of the semiconductor element,
the control IC includes a plurality of signal pads of the control IC,
the plurality of signal pads in the control IC are wire-bonding connected to one of the signal pad groups closer to the plurality of signal pads in the control IC in the pair of signal pad groups in the semiconductor element,
the pair of signal pad groups in the semiconductor element include a plurality of sense signal pads, and
the plurality of sense signal pads included in one of the pair of signal pad groups are wire-bonding connected to one of the plurality of signal pads in the control IC.

* * * * *